United States Patent [19]
Nevill et al.

[11] Patent Number: 5,764,574
[45] Date of Patent: Jun. 9, 1998

[54] METHOD AND APPARATUS FOR BACK-END REPAIR OF MULTI-CHIP MODULES

[76] Inventors: Leland R. Nevill, 6803 Diamond St.; Gary R. Gilliam, 6410 Randolph Dr., both of Boise, Id. 83709; Kevin Duesman, 4084 S. Suntree Way, Boise, Id. 83706

[21] Appl. No.: 666,247

[22] Filed: Jun. 20, 1996

[51] Int. Cl.$^6$ ............................................. G11C 7/00
[52] U.S. Cl. ............................................. 365/200; 365/230.03
[58] Field of Search ............................. 365/200, 230.03, 365/193

[56] References Cited

U.S. PATENT DOCUMENTS

| | | | |
|---|---|---|---|
| 5,430,679 | 7/1995 | Hiltebeitel et al. | 365/200 |
| 5,455,798 | 10/1995 | McClure | 365/200 |
| 5,491,664 | 2/1996 | Phelan | 365/200 |
| 5,528,600 | 6/1996 | El Ayart et al. | 365/200 X |
| 5,550,394 | 8/1996 | Sukegawa et al. | 365/200 X |

*Primary Examiner*—Do Hyun Yoo
*Attorney, Agent, or Firm*—Arnold, White & Durkee

[57] ABSTRACT

A method and apparatus for independent redundancy programming of individual components of a multiple-component semiconductor device assembly. In the disclosed embodiment, a multiple-chip memory module includes a plurality of memory devices each having redundant circuitry therein for facilitating backend repair of those devices should a defective memory cell (or group of memory cells) be detected. The redundant circuitry in each device is responsive to a predetermined combination of programming signals applied to terminals of that device to activate a redundant column (or row) of memory cells into operation in place of a column (or row) containing a defective memory cell. In the disclosed embodiment, the predetermined combination of programming signals includes at least one signal applied to a data terminal of the device. The interconnection of individual memory devices in the multiple-device assembly is such that a predetermined combination of signals applied to predetermined terminals of the assembly, including at least one data terminal thereof, can uniquely identify an individual one of the plurality of individual memory devices in the assembly, facilitating back-end repair of the assembly without requiring disassembly thereof.

17 Claims, 4 Drawing Sheets

METHOD AND APPARATUS FOR BACK-END REPAIR OF MULTI-CHIP MODULES

FIELD OF THE INVENTION

This invention relates generally to the field of semiconductor devices and, more particularly, relates to semiconductor devices having redundancy circuitry therein.

BACKGROUND OF THE INVENTION

Semiconductor memory devices, such as dynamic random-access memories (DRAMs) and static random-access memories (SRAMs), and the like are typically arranged in arrays of rows and columns of individual memory cells or locations, each location capable of storing electrical charge representative of a single digital bit of information, i.e., a "1" or "0".

To access binary information stored in a conventional semiconductor memory device, the binary address of the location to be accessed is applied to address inputs of the device. This address, which is decoded by decoding circuitry associated with the device, identifies a unique row and a unique column of the memory array, with the location to be accessed being found at the intersection of the specified row and column.

In the fabrication of semiconductor memories, one technique utilized to increase production yield is to provide redundant circuits on the chip to allow for the replacement of circuits which prove, during testing of the device, to be defective. During testing of the chip, if a defective circuit is identified, a redundant circuit is activated to take the defective circuit's place. This can be accomplished by opening an associated fuse or similar mechanism.

On-chip redundancy has been shown to be especially suited for repetitive circuits having a large number of repeating elements in some form of array, such that one redundant circuit can replace a defect found in any one of a large number of circuit elements. In memory devices, for example, it has been shown that redundant rows or columns of memory cells can be provided so that if one memory element (or multiple elements in one row or column) in the memory array or sub-array of the device is found to be defective, a redundant row or column can be substituted for the row or column in which the defective cell (or group of cells) is located. Due to the repetitive character of memory arrays, a single redundant row or column can be available to replace a large number of potentially defective rows or columns.

One difficulty in providing redundant rows or columns of memory cells in a memory device is maintaining address integrity; that is, a redundant row or column must appear to have the same address as the row or column that it replaces. Since redundant rows or columns are not activated until after the device has been tested and a defective cell has been identified, assignment of addresses to redundant rows and columns cannot be done up front. To address this issue, there is usually associated with the redundancy circuitry of a memory device a universal decode circuit which includes one-time programmable devices, e.g., fusable links or the like, which can be activated to program the decode circuitry to be responsive to the appropriate address(es).

Fabrication of one-time programmable devices for implementing redundancy circuitry in semiconductor devices has conventionally been done by constructing metal fuse elements that are "blown" open by application of high current. Another method involves construction of metal or polysilicon fuses which are blown open with a laser. Various other known types of programmable cells, such as electrically-programmable read-only memory (EPROM) cells, have also been used for this purpose.

U.S. Pat. No. 4,543,594 proposes using a planar capacitor as a fusible, one-time programmable link. This type of link is programmed by application of a high-energy (high-current) signal, which breaks down the dielectric of the capacitor to establish a conductive path therethrough. Since this type of link conducts after, not before, it is blown, it is sometimes referred to as an "antifuse."

One-time programmable fuse and/or antifuse devices used for implementing on-chip redundancy in semiconductor memories are also described in U.S. Pat. No. 4,491,857 to McElroy; U.S. Pat. No. 4,598,388 to McElroy; U.S. Pat. No. 4,881,114 to Mohsen et al., U.S. Pat. No. 5,110,754 to Lowrey et al.; U.S. Pat. No. 5,241,496 to Lowrey et al., U.S. Pat. No. 5,324,681 to Lowrey et al.; and U.S. Pat. No. 5,331,196 to Lowrey et al. The Lowrey et al. '754, '496, and '196 patents are each hereby incorporated by reference herein in their respective entireties.

A notable distinction between laser-actuable (laser-blowable) and electrically-actuable (electrically-blowable) one-time programmable devices is that the former can only be programmed prior to packaging of the semiconductor device, whereas the latter can be programmed even after encapsulation of the semiconductor die in plastic or other material. Thus, redundancy circuits which utilize electrically-actuable fuses or antifuses can theoretically be activated at any time during the life of the device.

A typical technique for electrically programming redundancy circuitry in a memory device involves application of specific combinations of signals to certain inputs of the device. The redundancy circuitry includes circuitry for recognizing these signals as indicating that a redundant element is to be substituted for a defective one. Thereafter, the address of the element to be replaced is applied (for example, to the address input pins of the device), and a programming signal is applied to actuate or blow the appropriate fuses or antifuses, so that the redundant element will be addressed rather than the defective element during subsequent normal operation of the device.

Preferably, the combination of signals required to accomplish programming of redundancy circuitry in a memory device is a combination that would not occur during normal operation of the device. For example, in certain devices manufactured by the assignee of the present invention, a so-called "supervoltage"—a voltage of eight to ten volts or so, well above normal input and output voltages for CMOS semiconductor memories—is applied to the column address strobe (CAS) input to the device to initiate redundancy programming. Simple voltage level detection circuitry associated with the redundancy circuitry detects the supervoltage, and redundancy programming is only allowed when the supervoltage is detected.

As noted above, redundancy circuitry which utilizes electrically-actuable links for programming can be programmed at any time during the operational life of the device. A problem arises, however, in redundancy programming for devices which are incorporated into an assembly which includes multiple individual semiconductor devices.

The well-known and commercially popular single in-line memory module (SIMM) is an excellent example of how this problem, which will be hereinafter described in further detail, can arise. As those of ordinary skill in the art will appreciate, SIMMs (and common variants thereof, including dual in-line memory modules (DIMMs), multiple in-line memory modules (MIMMs), multi-chip modules (MCMs), and the like) incorporate multiple individually packaged memory devices, e.g., DRAMs, onto a common carrier or substrate, for example, a printed circuit board or the like. The substrate is adapted to be inserted into the socket such as may be found on the motherboard of a personal computer, such that the individual memory devices that make up the SIMM can be addressed as if they were actually a single memory device.

Typically, SIMMs (and DIMMs, MIMMs, MCMs, and the like) are configured such that when a given addressed "location" is accessed, the data at the same location in each of the individual memories in the SIMM is accessed. For example, when an address is presented to a typical eight-chip SIMM, that same address is applied to the address inputs of each of the eight memories, so that the same location in each of the eight memories is accessed.

For a data read cycle, each chip in a SIMM presents the contents of the addressed location in its array on its data output terminal(s). The data output terminals from all eight of the memories are then presented in parallel on multiple data output terminals of the SIMM. If each memory in the eight-chip SIMM is bit-wise addressable (such that a single memory cell is accessed during any read or write cycle), then the SIMM is said to be byte-wise addressable, since application of a single address results in access to eight bits, one in each of the eight memories in the SIMM.

Various SIMMs and other multi-chip memory devices are known and commercially available. A typical SIMM is described in U.S. Pat. No. 5,089,993 to Neal et al., and the assignee of the present invention manufactures and sells various different multi-chip memory devices, for example the Micron MP8D 132 memory module.

The problem with utilizing redundancy circuitry in multiple-chip memory devices is that it can be difficult to program the redundancy circuitry of any given individual memory in the device independently. This difficulty arises due to the common interconnection of many of the input and output terminals of the individual devices.

For example, in most SIMMs, the row address strobe (RAS) and column address strobe (CAS) inputs to each individual memory device are coupled together, so that only single CAS and RAS inputs to the SIMM are necessary for access. Similarly, as described above, the address signals applied to the SIMM are typically routed in the SIMM's circuitry to be applied to the address inputs of each individual memory device therein.

Given this arrangement, if redundancy programming in the individual memories of a SIMM is accomplished as described above, i.e., by applying a supervoltage to the CAS input, then it would be impossible to program the redundancy of one individual memory device in the SIMM without also programming the redundancy of all other memory devices in the SIMM identically. This is undesirable, since it is highly unlikely that the same row or column in any of the other individual memory devices of the SIMM will have a defective cell. For the memory devices other than the one for which redundancy programming is desired, redundancy programming unnecessarily substitutes the redundant element for a non-defective element and makes the redundant element unavailable for replacing a defect elsewhere in those other chips.

While it might be possible to remove an individual memory device from a SIMM in order to program its redundancy independently of the others, this is often not at all practical. Often, the individual components of a SIMM are soldered onto the carrier or substrate, such that they are not easily removed and then reattached.

SUMMARY OF THE INVENTION

In view of the foregoing considerations, the present invention relates to a method and apparatus for redundancy programming in multiple-chip semiconductor devices.

BRIEF DESCRIPTION OF THE DRAWINGS

The foregoing and other aspects of the present invention may perhaps be best appreciated with reference to a detailed description of a specific embodiment of the invention, when read in conjunction with the accompanying drawings, wherein.

DETAILED DESCRIPTION OF A SPECIFIC EMBODIMENT OF THE INVENTION

Figure 1:
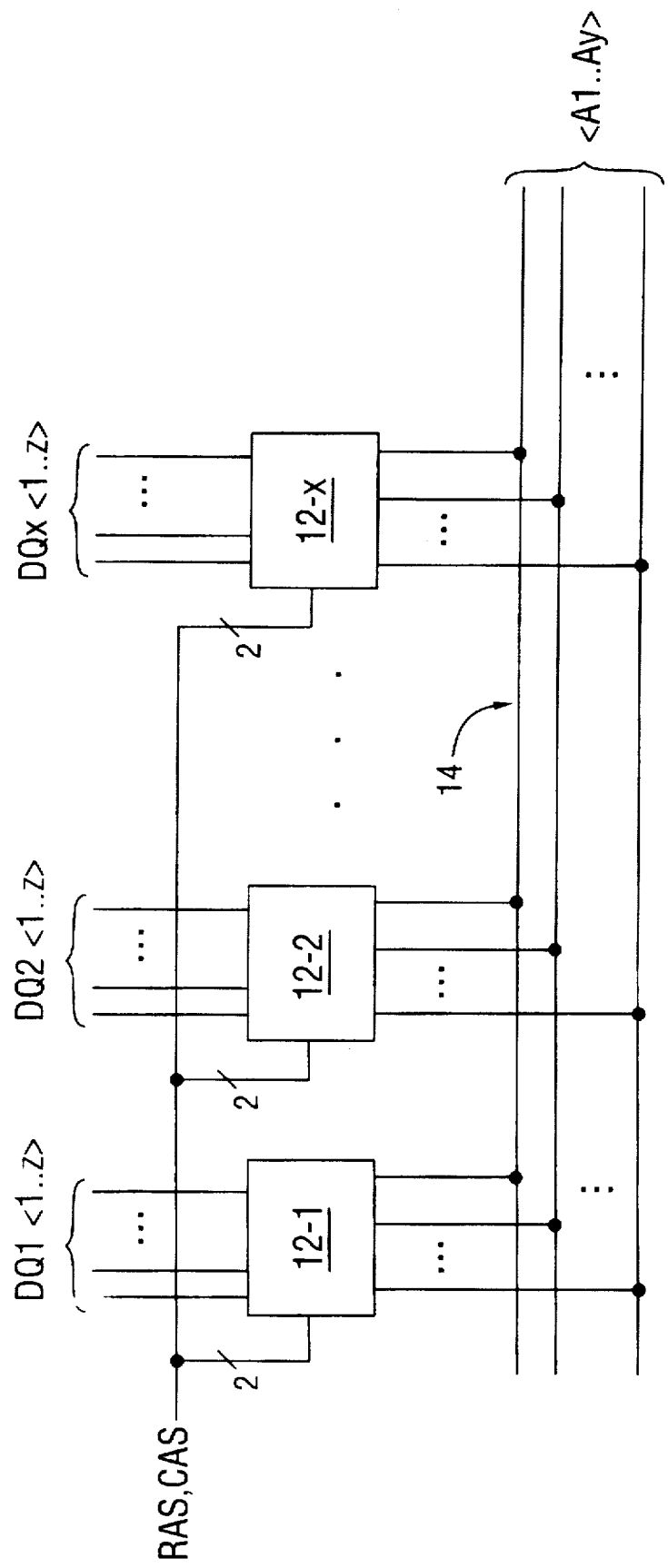
FIG. 1 is a simplified block/schematic diagram of a multi-component semiconductor assembly in accordance with one embodiment of the present invention.

Referring to FIG. 1, there is shown a simplified block diagram of a multiple-component memory module 10 in accordance with one embodiment of the present invention. Although the present invention will be described herein in the context of the memory module of FIG. 1, it is to be understood that the present invention is not limited to this specific application. It is contemplated that the present invention may be advantageously practiced in connection with many types of semiconductor devices, particularly those in which multiple components are coupled together, including but not limited to SIMM, DIMMs, MIMMs, MCMs, and the like. It is believed that those of ordinary skill in the art having the benefit of the present disclosure will be readily able to adapt the exemplary teachings herein to practice the present invention in other applications.

The memory module of FIG. 1 includes a plurality x of individual memory devices 12-1, 12-2 . . . 12-x. Those of ordinary skill in the art will recognize this as a common configuration of a SIMM. In memory module 10 of FIG. 1, memory devices 12-1 . . . 12-x may be separately packaged integrated circuits (IC) mounted on a printed-circuit board type of substrate, or alternatively may be commonly packaged semiconductor dies mounted on a suitable substrate.

As shown in FIG. 1, each memory device 12-1 . . . 12-x has a plurality y of address input pins for receiving y address input signals A1 . . . Ay from an address bus 14. Address bus 14 functions to communicate address signals applied externally to address input terminals of device 10 to the address input pins of memory devices 12-1 . . . 12-x. In accordance with conventional practice, each memory device 12-1 . . . 12-x receives the same y address inputs.

Each memory device 12-1 . . . 12-x also has a plurality z of data input/output (I/O) terminals. As used herein, the term "terminal" or "I/O terminal" will be used to designate a point of connection between a semiconductor device and external sources or destinations of digital signals. In this sense, "I/O" should be taken to mean either input or output or both. For example, those of ordinary skill in the art will appreciate that for semiconductor memories, address terminals are typically input terminals only, while data terminals are often both input and output terminals. Nevertheless, both address terminals and data terminals are often referred to as "I/O terminals." Also, for the purposes of this disclosure, a distinction will be made between the electrical terminals of a semiconductor device assembly, such as a SIMM, which facilitate connection of the assembly to other electronic components (e.g., a computer motherboard), and the electrical or I/O terminals of the individual semiconductor devices which make up the assembly (e.g., bond pads or IC leads).

In the presently disclosed embodiment of the invention, each device 12-1 ... 12-x is z-bit-wise addressable, i.e., each y-bit address accesses z bits of data in the device's array. (For bit-wise addressable memory devices, z=1; for byte-wise addressable memory devices, z=8.) In FIG. 1, the data I/O pins for device 12-1 are designated DQ1<1 ... z>, the data I/O pins for device 12-2 are designated DQ2<1 ... z>, and so on. Also in accordance with conventional practice, the DQ outputs from devices 12-1 ... 12-x are not tied commonly together as the address inputs are. Thus, while a given address <A1...Ay> applied to any one of the memory devices 12-1 ... 12-x would access a particular one of $2^{y-1}$ locations in that device—a total of z bits—a given address <A1...Ay> applied to memory module 10 would access a particular one of $2^{y-1}$ locations in each memory device 12-1 ... 12-x—a total of z times x bits. That is, each address applied to memory module 10 accesses z times x bits, and memory module 10 must therefore have z times x data I/O terminals.

Figure 2:
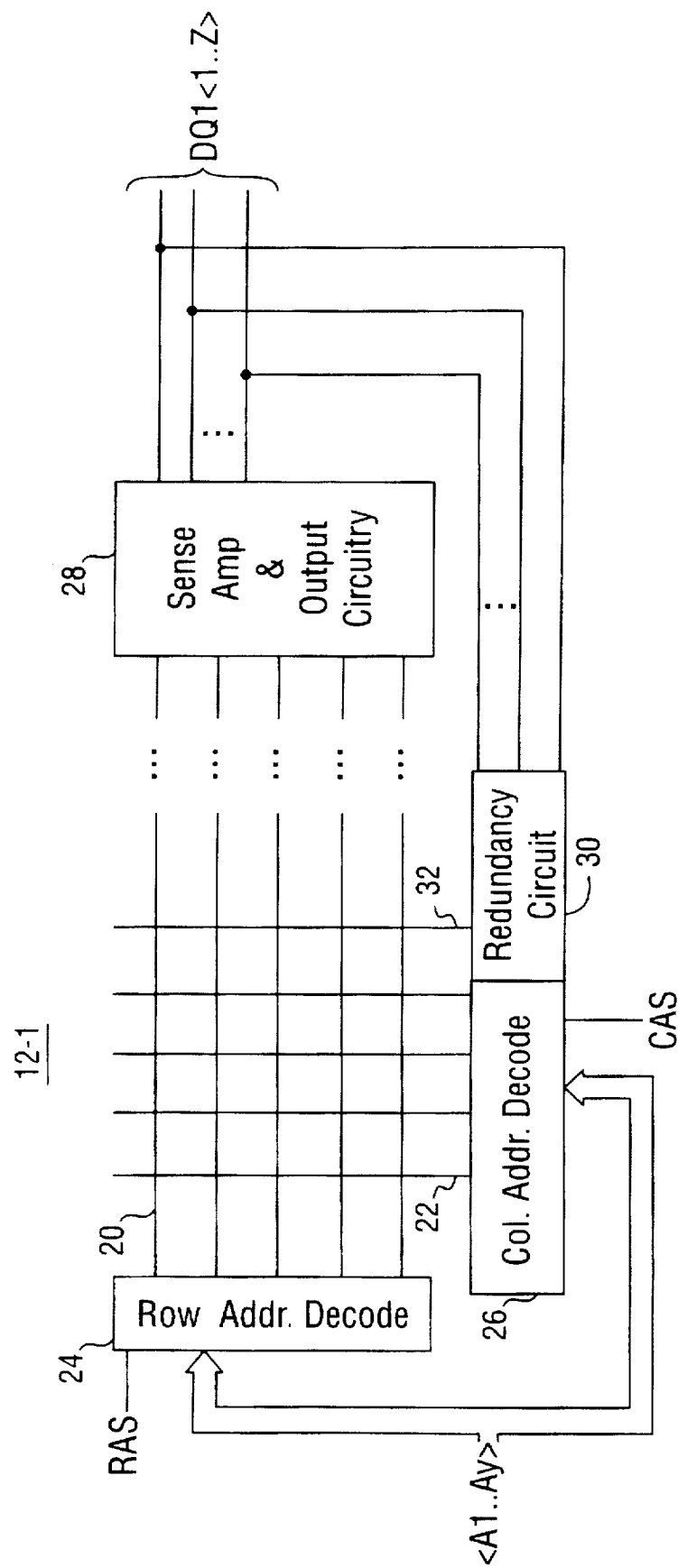
FIG. 2 is a simplified block/schematic diagram of a typical one of the components from the assembly of FIG. 1.

Turning now to FIG. 2, there is shown a greatly simplified block diagram of memory device 12-1 from the memory module 10 of FIG. 1, it being understood that in the presently disclosed embodiment of the invention, memory devices 12-1 ... 12-x are identical. As shown in FIG. 2, memory device 12-1 comprises an array of row lines 20 and column lines 22 with a memory cell (not shown in FIG. 2) being disposed at every intersection between a row line 20 and a column line 22.

Memory device 12-1 further comprises a row address decoder 24 and a column address decoder 26. Decoders 24 and 26 receive address signals <A1...Ay> from an external source and function to select an individual row and column, respectively, in the array. Row address decoder 24 receives the row address strobe (RAS) signal in order to be informed when a valid row address is appearing on the address inputs to device 12-1. Likewise, column address decoder 26 receives the column address strobe (CAS) signal to be informed when a valid column address is appearing on the address inputs.

Once row and column addresses have been received and decoded in device 12-1, data from the selected memory cell(s) will be sensed by sense amplifier and output circuitry 28, which presents the data on data I/O (DQ) lines DQ1<1 ... z>.

As thus far described, memory device 12-1 is entirely conventional in character, and no further description of its architecture is believed to be necessary herein for the purposes of describing the present invention. It is believed that those of ordinary skill in the art will be familiar with various implementations of semiconductor memory devices with which the present invention may be practiced.

With continued reference to FIG. 2, memory device 12-1 further comprises column redundancy circuitry 30 associated with column address decode circuitry 26. Redundancy circuitry 30 is provided in order to provide a redundant column line 32 for the array, which may be switched into operation in place of a primary column line to which a defective memory cell is coupled. (In an alternative embodiment, memory device 12-1 could have row redundancy circuitry associated instead of, or in addition to, column redundancy; it is believed that this detail, however, is not relevant to the understanding and practice of the present invention. Also, while memory device 12-1 in FIG. 2 is shown to have only one redundant column line 32, in some applications multiple redundant elements may be provided.)

In accordance with conventional practice in the art, redundancy circuitry functions to substitute redundant column line 32 for a primary column line 22. While not shown in detail in the Figures, redundancy circuit 30 includes one-time programmable devices, such as conventional fuses, antifuses, or the like, to enable custom programming of the device's redundancy should a defective column be discovered.

In accordance with one aspect of the invention, redundancy circuit 30 is coupled to data I/O (DQ) lines DQ1<1 ... z> and, as a result of its association with column address decode circuitry 26, also receives address signals <A1 ... Ay> and CAS. Receipt of these signals is necessary in order to implement the redundancy programming in accordance with the presently disclosed embodiment of the invention.

Figure 3:
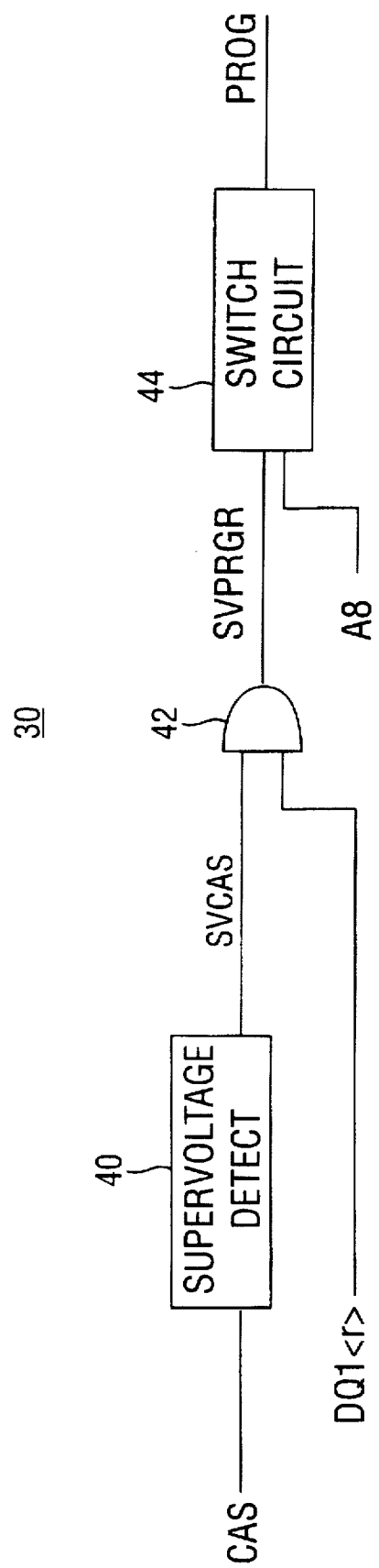
FIG. 3 is a simplified logic diagram of a portion of redundancy programming circuitry in the component of FIG. 2.

Turning now to FIG. 3, there is shown a simplified block diagram of a portion of redundancy circuit 30 in accordance with the presently disclosed embodiment of the invention. As noted above, and in accordance with common practice in the art, redundancy circuit 30 includes a level detect circuit 40 for detecting a "super-voltage" applied to the CAS input of memory device 12-1. The super-voltage is detectably higher than normal CMOS operating voltages, so that detection of the super-voltage can be used as an indicator that redundancy programming is to occur.

Upon detection of a super-voltage on the CAS input, detect circuit 40 asserts a signal designated SVCAS which is applied to one input of an AND gate 42. In accordance with the presently disclosed embodiment of the invention, another input of AND gate 42 is coupled to one of the data I/O lines DQ1<r>. As a result, when a super-voltage on CAS causes detect circuit 40 to assert SVCAS, the output of AND gate 42, a designated SVPRGR in FIG. 3 will be asserted if and when DQ1<r> is asserted.

SVPRGR is applied to one input of a switch circuit 44. In the presently disclosed embodiment of the invention, the high energy signal (programming signal) necessary to actuate or "blow" the fusable links in memory device 12-1 is applied to device 12-1 on one of the address input lines, in the illustrative embodiment, address line A8. Switch circuit 44 performs a simple pass gate function to allow the programming signal on address line A8 to pass through to the line designated PROG only when SVPRGR is asserted. PROG, in turn, is applied to the appropriate fusable links to effectuate the desired redundancy programming.

Figure 4:
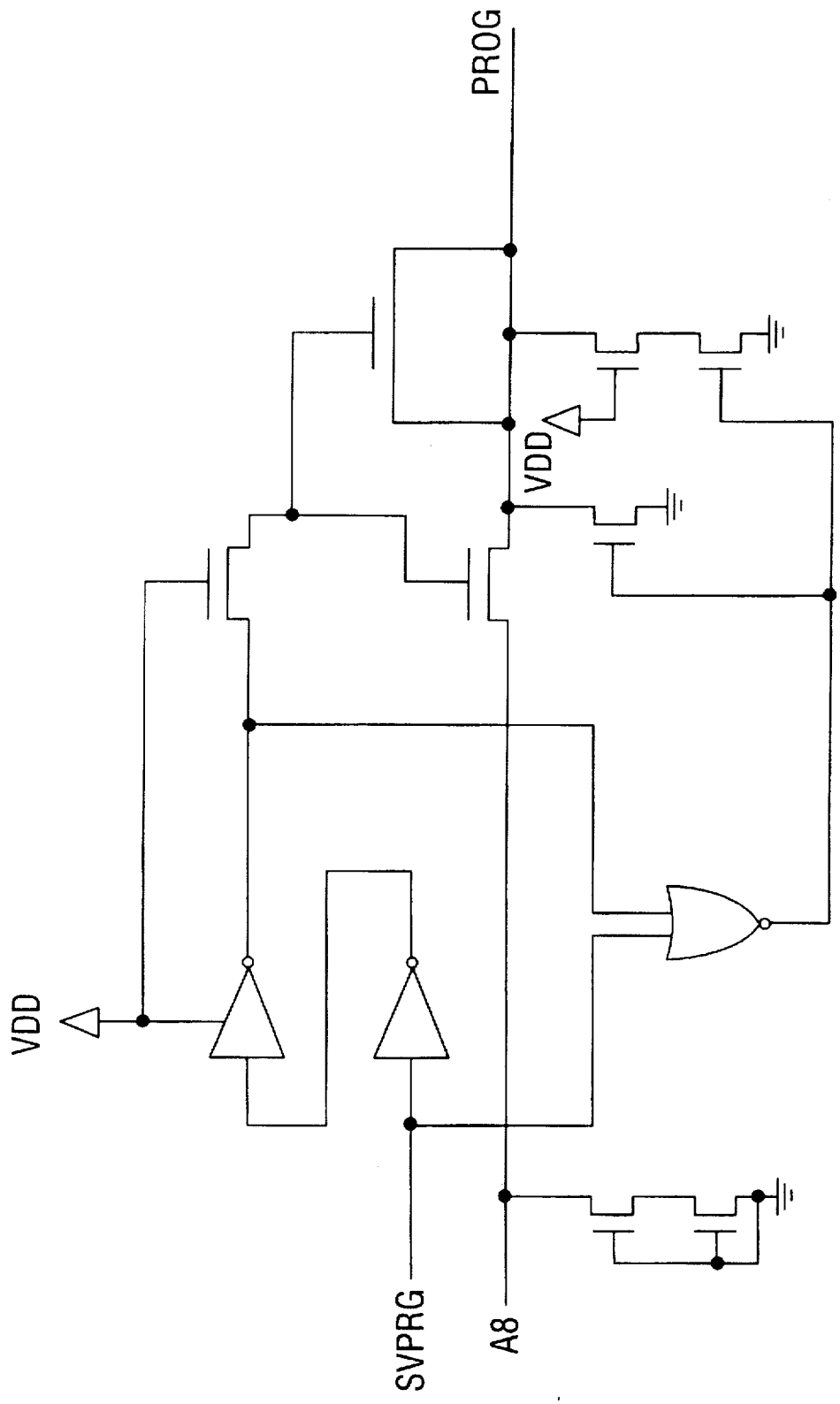
FIG. 4 is a logic/schematic diagram of a switch circuit in the circuitry of FIG. 3.

It is believed that those of ordinary skill in the art having the benefit of the present disclosure would be readily able to implement switch circuit 44 to perform the function described herein as a matter of routine engineering. However, for the sake of completeness of this disclosure, in FIG. 4, there is shown a schematic diagram of a presently preferred embodiment of switch circuit 44.

Summarizing, redundancy programming in accordance with the presently disclosed embodiment of the invention is accomplished by first applying a super-voltage to the CAS input of the memory device, while simultaneously asserting a predetermined data input signal DQ1<r>. If this is done, then the programming voltage applied to address input A8 will be passed through to the fusable links to be blown.

Those of ordinary skill in the art will readily comprehend that there are certain details of implementation of the redundancy programming circuitry that have not been described herein. For example, a person of ordinary skill in the art will appreciate that circuitry will preferably be provided to prevent the programming signal applied to address line A8 during redundancy programming from being applied to address decoding circuits 24 and 26. Additionally, those of ordinary skill in the art will appreciate that redundancy circuit 30 will include decoding circuitry for determining which fusable links are to be blown during redundancy programming. This could be accomplished in numerous ways, for example, by decoding appropriate information applied on address inputs other than A8. It is believed that these and other implementation-specific details are not relevant for the purposes of this disclosure, and in any event would be a matter of routine design and engineering to those of ordinary skill in the art.

An important aspect of the present invention lies in the configuration of redundancy detect circuit 30 to require assertion of one (or more, in alternative embodiments) data I/O lines in order to perform redundancy programming. As a result of this configuration, and also as a result of the signal routing in conventional multi-chip modules, such as depicted in FIG. 1, redundancy programming of one device in a multi-device assembly can be carried out without unnecessary and undesirable programming of other devices in the assembly.

In particular, independent redundancy programming of individual devices incorporated into a multiple-device assembly is made possible through including among the I/O terminals used for redundancy programming terminals of the individual devices which are coupled to I/O terminals of the overall assembly but which are not coupled to corresponding terminals of any other device in the assembly. In this way, a combination of programming signals applied to the I/O terminals of the assembly can uniquely identify an individual device in the assembly.

From the foregoing detailed description of a specific embodiment of the invention, it should be apparent that a method and apparatus for independent redundancy programming of individual components of a multiple-chip semiconductor device assembly has been disclosed. Although a specific embodiment of the invention has been described herein in detail, this has been done solely for the purposes of illustrating various aspects of the invention and is not intended to be limiting with respect to the scope of the invention. It is contemplated that various substitutions, alterations, and/or modifications, including but not limited to those specifically discussed herein, may be made to the disclosed embodiment without departing from the spirit and scope of the invention as defined in the appended claims.

For example, although the invention has been described herein in the context of a SIMM, it is contemplated that the present invention may be advantageously applied to other types of semiconductor device assemblies. Also, while the redundant element in the disclosed embodiment was a redundant row or column of memory cells in a semiconductor memory, it is believed that other types of semiconductor devices, e.g., microprocessors or the like, may incorporate other types of redundant functional elements that may be independently programmed or activated in accordance with the present invention.

What is claimed is:

1. A semiconductor device assembly, comprising:
   at least two semiconductor devices each having a plurality of I/O terminals for input and/or output of digital signals;
   wherein for each of said at least two semiconductor devices, a first subset of said each device's I/O terminals are connected to I/O terminals of at least one other of said at least two devices and to I/O terminals of said assembly;
   and wherein for each of said at least two semiconductor devices, a second subset of said each device's I/O terminals are coupled to I/O terminals of said assembly and are not coupled to corresponding I/O terminals of any other of said at least two devices;
   and wherein each of said at least two devices comprises:
      a primary functional element;
      a redundant functional element operable to function as a replacement for said primary functional element;
      a redundancy circuit, responsive to a predetermined combination of signals applied to predetermined ones of said each device's I/O terminals to deactivate said primary functional element and to activate said redundant element into operation in substitution for said primary functional element, said predetermined ones of said each device's I/O terminals including terminals in said first subset of said each device's I/O terminals and terminals in said second subset of said each device's I/O terminals;
      such that said redundant element in one of said at least two devices can be activated independently from said redundant element in any other of said at least two devices.

2. An assembly in accordance with claim 1, wherein said at least two devices are semiconductor memory devices.

3. An assembly in accordance with claim 2, wherein said at least two devices are dynamic random-access memory devices.

4. An assembly in accordance with claim 1, wherein said assembly is a memory module.

5. An assembly in accordance with claim 2, wherein said redundant element is a redundant column of memory cells.

6. An assembly in accordance with claim 2, wherein said redundant element is a redundant row of memory cells.

7. An assembly in accordance with claim 2, wherein said redundant element is a redundant block of memory cells.

8. An assembly in accordance with claim 2, wherein for each of said at least two devices, said second subset of said each device's I/O terminals includes at least one data I/O terminal of said each device.

9. A semiconductor device assembly having electrical terminals, said assembly comprising at least two semiconductor devices each having a plurality of electrical terminals, wherein said at least two devices each have a first subset of the electrical terminals commonly connected to electrical terminals of said assembly and a second subset of the electrical terminals independently connected to electrical terminals of said assembly;
   wherein each of said at least two devices comprises:
      a redundant functional element responsive to a predetermined combination of signals applied to said each device's first and second subsets of the electrical terminals to be activated into operation in place of a primary functional element of said each device;

such that said redundant element in one of said at least two devices is activatable into operation independently from said redundant element of any other of said at least two devices.

10. An assembly in accordance with claim 9, wherein said at least two devices are semiconductor memory devices.

11. An assembly in accordance with claim 10, wherein said at least two devices are dynamic random-access memory devices.

12. An assembly in accordance with claim 9, wherein said assembly is a memory module.

13. An assembly in accordance with claim 10, wherein said redundant element is a redundant column of memory cells.

14. An assembly in accordance with claim 10, wherein said redundant element is a redundant row of memory cells.

15. An assembly in accordance with claim 10, wherein said redundant element is a redundant block of memory cells.

16. An assembly in accordance with claim 10, wherein said second subset of the electrical terminals include at least one data I/O terminal of said at least two devices.

17. A semiconductor memory device, comprising:

a plurality address input terminals;

a plurality of data input/output terminals;

a plurality of control signal input terminals;

an array of rows and columns of memory cells adapted to store binary digital information therein;

a column decoder circuit responsive to address signals applied to said address terminals and a first predetermined combination of control signals applied to said control terminals to access an addressed column of said memory cells;

a redundant column of memory cells;

a redundancy control circuit coupled to said redundant column of memory cells and responsive to a second predetermined combination of programming signals applied to said data terminals and to said control terminals to activate said redundant column into operation in place of one of said columns in said array of rows and columns of memory cells.

* * * * *